INVENTORS
JOHN E. ALLEGRETTI
HEINRICH GUTSCHE
WILLIAM J. McALEER
BY Reverdy Johnson
ATTORNEY Dec. 28, 1965 J. E. ALLEGRETTI ETAL 3,226,269

MONOCRYSTALLINE ELONGATE POLYHEDRAL SEMICONDUCTOR MATERIAL

Original Filed Aug. 24, 1960 2 Sheets-Sheet 2

INVENTORS
JOHN E. ALLEGRETTI
HEINRICH GUTSCHE
WILLIAM J. McALEER

BY Reverdy Johnson

ATTORNEY 3,226,269
MONOCRYSTALLINE ELONGATE POLYHEDRAL SEMICONDUCTOR MATERIAL

John E. Allegretti, East Brunswick, N.J., Heinrich Gutsche, St. Louis, Mo., and William J. McAleer, Ambler, Pa., assignors to Merck & Co., Inc., Rahway, N.J., a corporation of New Jersey Original application Aug. 24, 1960, Ser. No. 53,575, now Patent No. 3,172,791, dated Mar. 9, 1965. Divided and this application May 12, 1964, Ser. No. 365,925
3 Claims. (Cl. 148—33.5)

This applicaion is a division of application Serial No. 53,575, filed August 24, 1960, now U.S. Patent 3,172,791, which in turn is a continuation-in-part of application Serial No. 19,054 filed March 31, 1960, now abandoned.

This invention relates to the formation of single crystal semiconductor materials and, more particularly, to monocrystalline semiconductor bodies comprising vapor-deposited layers having different conductivities separated by a transition region, all disposed within a polyhedral crystal configuration.

Semiconductor devices comprising at least two layers of semiconductor material different conductivities and separated by a transition zone have been well recognized in the art for the performance of an active function in an electrical circuit. To this point, there have been developed two methods of forming a transition zone, or junction, within a semiconductor body which are considered as being successful from a reproducible commercial standpoint. In all instances, for the most satisfactory semiconductor devices the starting material for the formation of a body containing a junction is a body of monocrystalline semiconductor material such as silicon, germanium or a compound of a Group III and a Group V metal such as gallium arsenide, indium phosphide, etc. The initial semiconductor body may be intrinsic, that is, not possessing appreciable active impurity atoms to impart to the body a specific type of electrical conductivity or, alternatively, the initial body may contain such active impurity atoms rendering thereto a predetermined electrical conductivity of either p or n type.

One common method of forming a p-n junction within such a semiconductor body is the alloying or fusion technique. In this process, a semiconductor body is contacted with a source of active impurity atoms as, for example, aluminum (in the case of silicon) or indium (in the case of germanium). A disk or pellet of aluminum is placed on a wafer of an n-type silicon semiconductor crystal. The assembly is then heated to a temperature above the eutectic temperature of aluminum and silicon but below the melting temperature of silicon. The body is then cooled and a p-type regrowth region of silicon containing the thermodynamic equilibrium solubility content of aluminum is formed. By this process the p-type regrown region is separated from the initial n-type body by a p-n junction. It may be seen that the alloy process has the limitation of not permitting control of the degree of conductivity of the regrowth region since the conductivity is fixed by the solid solubility of active impurity atoms in the regrown silicon region which, of course, is in turn determined by the segregation constant of silicon and aluminum.

The second common technique for the formation of junctions is known as the diffusion technique. In this instance, a solid or vapor source of active impurity atoms is placed in contact with the semiconductor body. The assembly is then heated to a high temperature but below the melting point of the semiconductor (i.e., heated to 1250° C. for silicon) and for a long period of time to cause the active impurity atoms to diffuse into the semiconductor body by physical migration and diffusion through the crystal lattice. The diffusion of the atoms follows a fixed distribution pattern with respect to the number of active impurity atoms present at any distance into the semiconductor body and the total distance for diffusion of any active impurity atoms. This distribution pattern has been established for known semiconductor materials with respect to known active impurity materials. The functional relation is described by Fick's law and by complementary error function curves for the respective materials at the temperatures involved. As may be appreciated, diffusion junctions have the disadvantage, in common with alloy junctions, that the number of active impurity atoms and position thereof within the semiconductor body are not variable at will since the active impurity atoms in a diffused junction must follow a physical distribution curve which is not within the control of the operator. This distribution curve also renders it difficult to accurately position a sharp transition region within the semiconductor body.

A third method of forming a junction within a semiconductor body is known as the grown junction technique. Unlike alloying and diffusion, in the grown junction technique the crystal of semiconductor material, together with occluded active impurity atoms, is formed from a molten mass thereof by pulling a single crystal by known techniques. At some stage of pulling the crystal, additional active impurity atoms of a type giving a conductivity of a type opposite to that in the initially formed crystal are added to the melt in quantities sufficient to change the conductivity type of the semiconductor body area next pulled from the melt. As is immediately apparent, the number of active impurity atoms added to the melt must be sufficient to compensate the number of opposite-type impurity atoms initially present in the melt and the formation of uncompensated conductivity layers is not possible after the first-formed layer. It is also apparent that the junction will be produced somewhere within a grown crystal transverse to the axis of formation thereof and requires special equipment to locate the junction at a desired point. Since relatively thin layers of semiconductor material of differing conductivities with a transition region therebetween are normally used for device manufacture considerable excess of semiconductor material is formed on either side of the junction, necessarily resulting in waste thereof. It is, therefore, apparent that this method of junction formation has not been commercially successful to any appreciable degree.

One other important consideration must be taken with respect to junctions formed in accordance with the foregoing procedures, and especially with respect to alloyed and diffused junctions. Lifetime is an important consideration in any semiconductor body from which devices are to be manufactured. It is recognized in the art that lifetime is substantially decreased in any semiconductor body formed if the body is exposed to elevated temperatures at some subsequent time. In the formation of alloyed and diffused junctions, it is inherent within the process that the semiconductor body be so exposed to elevated temperatures. It is believed that the adverse effects on lifetime are inherent in so treating a semiconductor body regardless of its environment but it is also important to recognize that any extraneous material on the crystal body during the heating procedure, e.g., oxides, salts from an operator's fingers, etc., also will have an unwanted, or at least certainly uncontrollable effect on the characteristics of the semiconductor body.

Accordingly, it is an object of this invention to provide a semiconductor body having at least two layers of semiconductor material with a transition region therebetween wherein the specific conductivities of each region at any point thereof are controlled, wherein no subsequent heat treatment of the initially-formed semiconductor layers is required for the formation of the transition region therein (thereby preserving lifetime), wherein the transition region is accurately positionable within the semiconductor body, and wherein the transition region is provided with substantial area and planarity.

It is a further object of this invention to provide semiconductor bodies having a plurality of layers of semiconductor material of known and controlled conductivity types and degrees resulting from the simultaneous in situ deposition of semiconductor material and active impurity atoms in a crystalline relationship to each other.

It is another object of the invention to provide a semiconductor body having a plurality of layers of different conductivities with transition regions therebetween, at least one of such layers being intermediately positioned within the body and having low conductivity characteristics.

These and other objects of the invention will become apparent from consideration of this disclosure read in conjunction with the accompanying drawings wherein.

Figure 1:
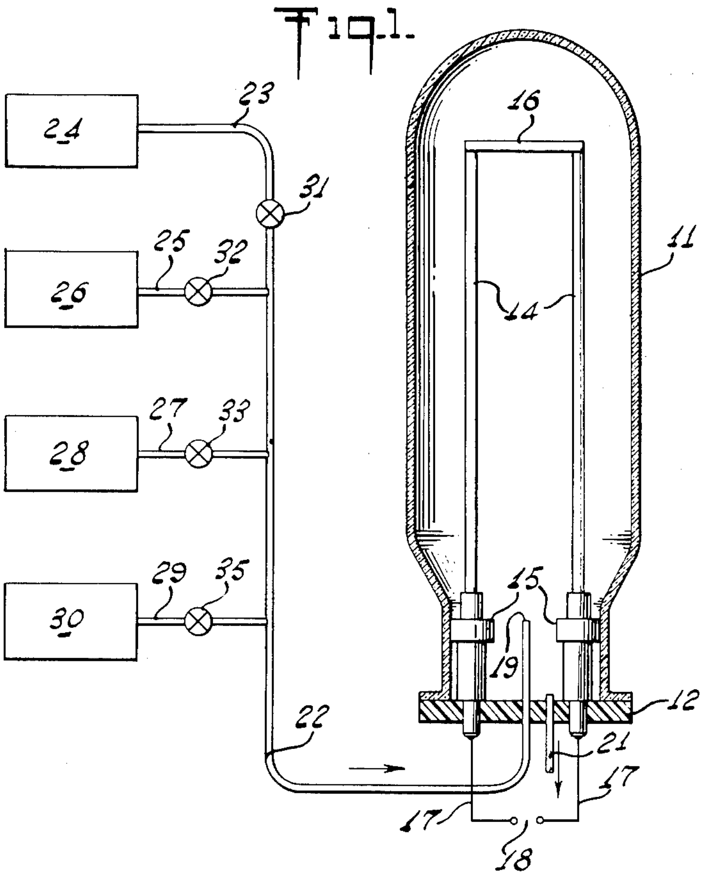
FIGURE 1 illustrates a suitable apparatus for carrying out the method of the present invention.

In general, this invention comprises the method of forming a semiconductor body having a plurality of layers of monocrystalline semiconductor material having different conductivities either in type or degree and separated by a transition region which includes the steps of providing a crystal of monocrystalline semiconductor material having a polyhedral form and at least the outer area thereof having a defined conductivity, the outer surface of the crystal being polygonally disposed with respect to the longitudinal axis thereof, and contacting the crystal with a decomposable vapor comprising semiconductor atoms and active impurity atoms and effecting deposition of the atoms from the vapor to form a monocrystalline layer of semiconductor material having a different conductivity than that of the crystal thereon, thereby providing a transition region having substantial planar areas polygonally disposed with respect to the longitudinal axis of the crystal. Preferably, the outer area of the initial crystal referred to above is also formed by a vapor deposition technique by a process where both layers of differing conductivities are formed in similar manner.

Accordingly, a more specific embodiment of this invention comprises the method of forming such a semiconductor body which includes the steps of providing a seed crystal of monocrystalline semiconductor material, providing a first decomposible vapor source of semiconductor atoms and atoms of active impurity element, effecting deposition of such atoms from such source to form a first layer of monocrystalline semiconductor material of a predetermined conductivity, continuing such deposition until the thus-formed crystal exhibits a polyhedral form with the outer surface of the first layer polygonally disposed with respect to the seed crystal core, discontinuing the flow of vapor source for the first-formed layer, providing a second decomposible vapor source of semiconductor atoms and active impurity atoms, the latter being present in quantity sufficient to result in a different conductivity in a subsequently-formed layer, and effecting deposition of such atoms from the second vapor source to form a second layer of semiconductor material of conductivity different from the first, thereby resulting in a polyhedral crystal having a plurality of layers of semiconductor material separated by a transition region wherein each layer and, of course, the transition region, is disposed polygonally around the seed crystal core and around any underlying layer, and wherein the transition region is substantially planar in areas and substantially parallel to the longitudinal faces of the polyhedral crystal.

It will be appreciated that the seed crystal and the first-deposited layer may be indistinguishable upon examination or chemical analysis of the finally-formed crystal. This would result, of course, if the seed crystal had an initial composition of semiconductor material and active impurity atoms identical to the composition deposited in the first layer. Generally, however, the core can be discerned through the use of proper techniques for the purpose since no particular care must be taken with respect to the characteristics of the seed core employed, the only critical factor being its monocrystallinity, although it may be oriented in some preferred manner.

The foregoing process may be employed in the formation of semiconductor bodies of known semiconductor materials with the only criterion being that a decomposable vapor source of the material be available. The terms "thermally decomposable," "thermal decomposition" and the associated deposit of a product of decomposition, as used herein, are intended to be generic to the mechanisms of heat-cracking as, for example, the decomposition of silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3 + H_2 \xrightarrow{\Delta} 2Si + SiCl_4 + 5HCl$$

used in the preferred embodiments of this invention as hereinafter indicated. For the sake of illustration, the following detailed description of apparatus used and crystal form obtained relates to the use of the invention in the formation of monocrystalline silicon semiconductor bodies.

Referring particularly to FIGURE 1, there is schematically illustrated a suitable apparatus for use in this invention. Generally, there is presented in FIGURE 1 a bell jar 11 sealed to a base 12 in order to form a closed reaction chamber. An appropriate number of silicon seed crystals or cores 14, more particularly defined hereinafter, are mounted within the bell jar. Seed crystals 14 are mounted within electrically conducting mounting chucks 15 at the lower end thereof and a conducting bridge 16 of silicon or graphite between the seed crystals is provided. Leads 17 are attached to the electrically conductive chucks 15 and are provided with terminals 18 to which a source of electrical energy (not shown) may be connected to supply electric current flow through the seed crystals 14 in order to heat them, as will be more fully described hereinafter. An entry port for reaction gases is provided by nozzle 19 which extends above the base 12 and into the interior of the reaction chamber formed by bell jar 11. An exhaust port 21 extends through base 12 in order to permit the removal of spent reaction gases from the chamber. Nozzle 19 is connected to conduit 22 extending through the base 12. Conduit 22 connects with the sources of vapors to be fed into the reaction chamber. Conduit 23 connects conduit 22 with a source of carrier gas 24. Conduit 25 interconnects conduit 22 to a vapor source of semiconductor material 26. Conduit 27 interconnects conduit 22 with a vapor source of active impurity atoms 28 and conduit 29 interconnects conduit 22 with a source of flushing gas 30. Valves 31, 32, 33 and 35 are utilized to open or close each of the conduits individually, as will be more fully explained hereinafter.

It will be appreciated that the arrangement of apparatus illustrated in FIGURE 1 is substantially schematic for ease in understanding the process of this invention and that various assemblies of lines and valves for feeding reaction gases to the reaction chamber may be provided in many differing configurations consistent with good engineering practices.

The procedure of the invention employing the apparatus of FIGURE 1 is as follows. After the seed crystal cores 14 are mounted in chucks 15 within the reaction chamber 11 and the electrically conducting bridge 16 is connected thereto, the seed crystals are heated by connecting the source of electrical energy (not shown) to terminals 18 so that current flow passes through the seed crystals 14. as the current flows through the seed crystals 14, their temperature is raised. Since silicon semiconductor material has a negative resistance temperature coefficient, that is, a high resistance to passage of electrical energy (when cold), it is preferable to initially heat the silicon seed crystals, for instance with a source of radiant energy imported through the walls of the reaction chamber. For simplicity of illustration, such heating means are not illustrated in FIGURE 1.

The seed crystals 14 are, as heretofore indicated, single crystals of semiconductor material, in the preferred embodiment, silicon. They are normally provided in the form of rods, which may be obtained from pulling the crystal from a molten mass of pure silicon by known techniques. They may, of course, be cut slabs of single crystal semiconductor material cut from a zone-refined crystal and then surface treated through lapping, etching, etc., to present a smooth surface for subsequent single crystal growth. Specific orientation of crystal surfaces in the finally -formed products may be provided by providing the appropriate crystallography in the seed crystal. In many instances it is preferred that the faces of the polyhedral crystals of silicon formed in accordance with this invention have the longitudinally extended faces of the crystal oriented in the (111) plane. This is accomplished by forming the initial seed crystal so that the sum of the Miller indices of the plane transverse to the longitudinal axis of the starting element is equal to zero, as, for example, the ($\bar{2}11$) plane, which, in turn, is accomplished by appropriately orienting the small crystal used in pulling the seed crystal, as is known in the art. With specific orientations of the seed crystals as indicated above, the grown crystal is formed as an initial twelve-sided figure which upon further build-up of the layer results in the hexagonal form illustrated. Other orientations result in other polygonal dispositions of the faces of the crystals formed as, for example, essentially a square when the (110) plane is transverse to the longitudinal axis of the seed crystal.

Current flow is continued until the silicon seed crystals are initially heated to a temperature of the order of about 1250° C. (All temperatures indicated herein were determined by optical pyrometer observation of the crystal.) At this point, valve 31 is opened and the carrier gas alone is permitted to flow through conduits 23 and 22 through the nozzle 19 and into the interior of the reaction chamber 11 as a free jet of gas. In the presently preferred embodiment of this invention wherein the formation of a silicon crystal is being described, the carrier gas is preferably hydrogen. At the temperature indicated, the hydrogen serves to cleanse the surface of the seed crystals, preparing them for single crystal growth. Regardless of the degree of care taken in the preparation of the initial seed crystals, it is believed that some oxidation of the surface thereof occurs from their exposure to the atmosphere and the flow of hydrogen gas at the temperature involved apparently removes these oxidized layers. Regardless of the theory involved, the surface treatment of silicon with hydrogen gas does enable subsequent single crystal growth.

After a period of time adequate to insure a clean surface, normally 30 minutes to an hour, the temperature of the seed crystals is adjusted to the temperature adequate to provide thermal decomposition of a vapor source of semiconductor atoms. In the presently preferred embodiment of this invention the source material for silicon atoms to be used in crystal growth is silicochloroform (trichlorosilane) although other halides such as silicon tetrachloride, silicon tetrabromide, etc., and silane itself may be employed with appropriate adjustments made in temperature, gas mol ratios, flow rates, etc. The optimum temperature of the seed crystals when silicochloroform is used has been found to be approximately 1170° C. In further proceeding, the carrier gas, hydrogen, from its source 24 is mixed with the silicochloroform from source 26 by feeding the latter to conduit 22 through valve 32.

The hydrogen is admixed with the silicochloroform and fed through conduit 22 into the reaction chamber 11 through the nozzle 19. At the same time, appropriate quantities of a vapor source of active impurity atoms are fed from source 28 and through conduit 27 and valve 33 to the flow of hydrogen and silicochloroform through conduit 22 in all instances where such impurities are desired in the layer being formed. All of the vapor feeding is, of course, controlled through the appropriate valves illustrated as controlling the respective feed lines. As will be appreciated, to ensure single crystallinity of the grown crystal from the thermally decomposable sources of semiconductor material and active impurity atoms there is required a balance between the temperature at the surface of the seed crystal, the flow rate of reaction gases through the chamber, and the mol ratios of vapors, that is the carrier gas, the vapor source of semiconductor atoms and the vapor source of active impurity atoms. Too low a concentration of vapor source for semiconductor atoms will result in low deposition rates, below those commercially practical. Too high or too low a temperature or too high a concentration of vapor source for semiconductor atoms will result in polycrystalline growth from temperature alone or too great a supply of semiconductor atoms deposited on the crystal, thereby preventing orientation of the atoms in an orderly arrangement thereof. The concentration of vapor source of active impurity atoms, while small in relation to the total gas flow, must be adequate to result in the desired conductivity in the formed crystal.

As heretofore indicated, a temperature of the seed crystal of the order of 1170° C. is optimum when used with a vapor of approximately 240 grams of silicochloroform per hour entrained in 5.5 liters per minute of total gas flow through the reactor. This mixture results in a mol ratio of silicochloroform to hydrogen of approximately 0.12, and variations of this mol rate within a range of approximately 0.015 to 0.30 and preferably 0.06 to 0.20 may be employed in the case of silicochloroform and hydrogen. Under these temperature and flow rate conditions in the process described, approximately 11 grams per hour of silicon is deposited. As is apparent, the amount of vapor source of active impurity atoms can be mathematically related to the silicochloroform weight introduced into the reaction chamber to obtain desired conductivities.

Figure 2:
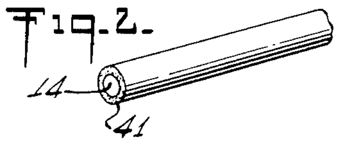
FIGURES 2 through 4 illustrate an elongated polyhedral semiconductor body formed in accordance with the method of the present invention at the various stages of formation thereof.

Gas flow into and through the reaction chamber is continued to form a layer of atoms of semiconductor material, silicon, and, if desired, active impurity atoms (for example, boron, if p-type material is desired) in a crystalline relation resulting from the codeposition of the atoms as decomposition products of the vapor sources thereof in reaction contact with the then-existing crystalline surface. Upon initial deposition the seed crystal accepts the deposited atoms and, with specific orientation of the seed crystal as heretofore indicated, i.e., the (211) plane perpendicular to the longitudinal axis of the seed crystal, the crystal grows as indicated in FIGURE 2 through deposition of a layer 41 of predetermined conductivity due to the composition of the gas flow. Deposition is continued under these same conditions until layer 41 grows to a degree sufficient to form the polyhedral crystal illustrated in FIGURE 3. As indicated therein, the silicon crystal thus formed in the manner defined herein is an elongated crystal with the outer surface thereof essentially forming a hexagon disposed around the core of the seed crystal 14. The transition from the cylinder form of seed crystal 14 to the hexagon indicated in FIGURE 3 is through a twelve-sided crystal with eventual elimination of six of the sides and an increase in face width of the six remaining sides, two of which are then oriented in a (111) plane while the other four are [131] planes.

Figure 3:
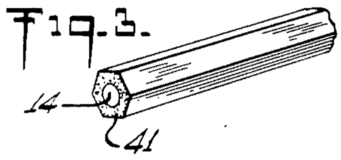

Preferably, but not essentially, the silicon crystals thus formed, as illustrated in FIGURE 3, are dissociated from any excess active impurity atoms present within the reaction chamber 11 and not within the structure of the crystals themselves. In the preferred embodiment, a gas flow procedure employing a vapor reactive with such impurities, as more particularly described in application Serial No. 27,938, filed May 9, 1960, now abandoned, is employed. As indicated in that application, it is possible, of course, to remove the crystals thus formed to a second reaction chamber, although commercial considerations may dictate otherwise. This dissociation procedure is used in any instance where in the next-formed layer of semiconductor material a relatively low conductivity is desired. If high conductivity material is to be next formed on the crystal, the dissociation may be dispensed with since the number of active impurity atoms fed in the gas stream for deposition on the crystal to form the high conductivity layer will be in quantity adequate to overpower the characteristics which the excess impurity atoms left in the system might impart to the second-formed layer.

Additional layers of monocrystalline semiconductor material may be deposited on the thus-formed crystals in manner similar to that described above with respect to the first-formed layer. Appropriate changes will be made in the source of active impurity atoms from source 28 in either type of active impurity atoms or quantity thereof fed to the flowing reaction gas stream, or a combination of both, dependent upon the type of layer desired and the desired conductivity thereof.

The sources of active impurity atoms are, as heretofore indicated, thermally decomposable volatile compounds of those elements known in the art to alter the intrinsic electrical properties of the semiconductor material by acting as donors or acceptors in semiconductor bodies. Such elements include, in the case of silicon, boron, aluminum, gallium, phosphorus, arsenic, antimony as is known. In bodies of semiconductor material other than silicon the donor and acceptor elements known to be appropriate therefor are used. Ideal success has been had with the use of boron trichloride in the formation of p-type layers, and phosphorus trichloride in the case of n-type layers, and because of ease of handling these materials in the process, they are preferred for appropriate silicon doping in commercial embodiments of this invention.

As an example of a specific semiconductor device which may be formed in accordance with the method of the present invention, a p+nn+ semiconductor diode having a peak inverse voltage of 1,000 volts may be formed as follows. A silicon starting element having a diameter of approximately 5 millimeters is supported within the reaction chamber. A mixture of approximately 240 grams per hour of silicochloroform and 330 liters per hour of hydrogen carrier gas along with sufficient boron trichloride to provide approximately $10^{18}$ carriers per cc. of silicon is introduced into the reaction chamber. By maintaining the temperature at the surface of the silicon starting element at approximately 1170° C., a deposition rate of between 10 and 11 grams per hour of silicon along with atoms of boron are deposited upon the silicon single crystal starting elements. These conditions are maintained for approximately eight hours which will produce a 2 millimeter thick layer upon the surface of the starting element. This 2 millimeter thick layer of p-type single crystal silicon has a resistivity of approximately 0.01 ohm centimeters.

The silicochloroform-borontrichloride-hydrogen gas is then removed from the reaction chamber, A vapor of silicon tetrachloride and hydrogen is utilized to flush the system and remove undesired atoms of boron which are present within the interior of the reaction chamber, in accordance with the procedure defined in the above-identified copending application. The hydrogen gas is caused to flow through the chamber at approximately 5.5 liters per minute and approximately 6 grams per minute of silicon tetrachloride is contained within the hydrogen gas while the temperature of the crystal is maintained at approximately 1250° C.

After the flushing step the temperature of the crystal is reduced to about 1170° C. and a mixture of reaction gas containing 240 grams per hour of silicochloroform with 330 liters per hour of hydrogen along with sufficient phosphorus trichloride to provide $10^{14}$ carriers per cc. of silicon is introduced into the reaction chamber under the conditions as above outlined. This will provide a deposition rate of between 10 and 11 grams per hour. These conditions are maintained for approximately 30 minutes in order to provide a 6 mil thick layer of n-type semiconductor single crystal material having a resistivity of approximately 45 ohm centimeters. This layer of single crystal n-type material is separated from the previously deposited p-type layer of material by a very sharp, well-defined p-n junction.

After the six mil thick layer of relatively high resistivity n-type semiconductor material has been deposited, the concentration of phosphorus trichloride is increased in order to provide approximately $10^{18}$ carriers per cc. of silicon and thereby produce a layer of n+ type semiconductor material having a resistivity of approximately 0.01 ohm cm. The thickness of the n+ layer is not critical since this layer is used primarily to provide an ohmic contact to the n-type high resistivity layer of material previously deposited. However, there will be a definite transition region between the n and n+ layers of silicon.

The source of reaction gas is then removed from the reaction chamber and the crystals are permitted to cool at a rate of approximately 100° C. per minute after which they are removed from the reaction chamber.

Figure 4:
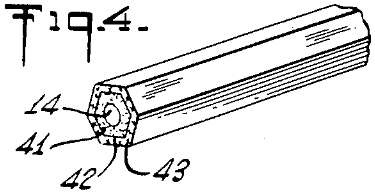
Figure 7:
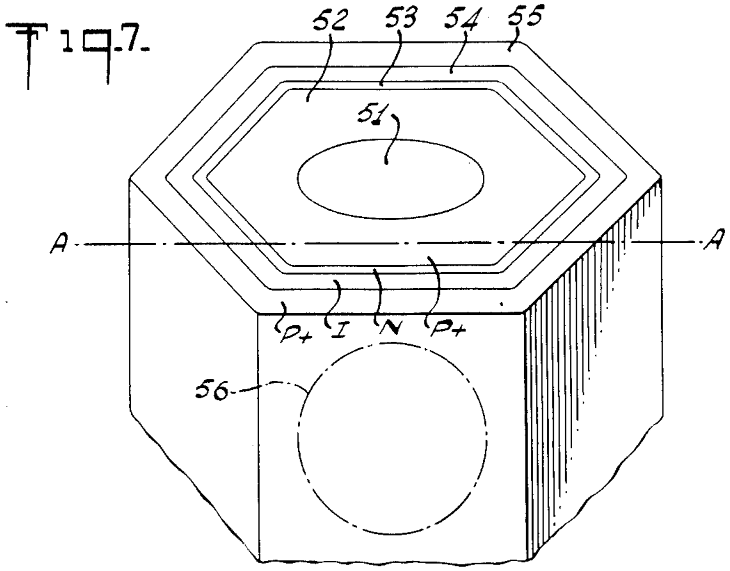
FIGURES 7 through 9 illustrate semiconductor devices which may be made in accordance with the present invention.

As may be immediately appreciated, any number of layers of differing conductivities with transition regions therebetween may be formed in accordance with this invention where, in each instance, once the polygonal crystal cross-section has been initially formed, each layer and the transition regions between adjacent layers will be polygonally disposed about the core and about any underlying layer and transition region. The most simple structure formed in accordance with the invention is illustrated in FIGURE 4 where the first-deposited layer is indicated as 41, a second-deposited layer is indicated as 43, and the transition region between layer 41 and layer 43 is indicated as 42. A complex structure formed in accordance with this invention is illustrated in FIGURE 7 and more particularly described hereinafter.

By following the teaching of this invention it is possible to form semiconductor bodies having a plurality of layers of differing conductivities, wherein the width of each layer may be precisely controlled. This allows the transition region or junction, if different type conductivity layers are involved, to be accurately positioned in the semiconductor body. It is also possible to provide in any layer formed any variation in conductivity desired in any plane parallel to the transition region by varying the concentration of vapor source of active impurity atoms in the flow to the reaction chamber during formation of the layer. The benefits from flexibility of such controls, compared to prior art techniques for forming transition regions, are immediately apparent.

In a body formed with a diffused transition region, the conductivity gradient follows Frick's law. In the semiconductor bodies formed in accordance with this invention, the conductivity gradient through the layer can be varied at will by the concentration of active impurity vapor in the gas stream. In a body having a transition region formed by alloying, the depth of the regrowth region (which forms one layer of the semiconductor body) is limited by the amount of semiconductor originally dissolved in the formation of a eutectic mixture with the active impurity. Unless lifetime be seriously impaired, the thickness of the regrowth area is minimal. In common grown junction techniques of pulling a crystal from a doped melt and further pulling from an additionally but opposite-type doped melt, except for the first grown layer uncompensated conductivity layers of low conductivity are not possible. On the other hand, this invention is capable of positioning an intrinsic layer of fixed width at any desired point in the sturcture and more particularly, between doped layers. It may be asserted that substantially all variations of structure are now feasible when the invention herein described is employed.

Figure 5:
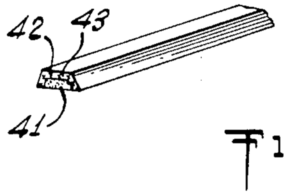
FIGURES 5, 6 and 6A illustrate the formation of semiconductor elements from the semiconductor body formed in accordance with this invention.
Figure 6A:
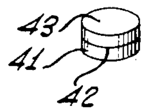
Figure 6:
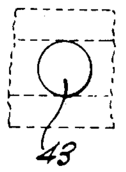

The fabrication of semiconductor devices from the polyhedral crystals formed in accordance with this invention is simple and, more important, does not necessarily have associated with it the further heating of the crystal with its inherent degradation of lifetime. Illustrated in FIGURE 5 is a slab of monocrystalline semiconductor material comprising a longitudinal section of the polyhedral crystal illustrated in FIGURE 4. It is immediately apparent from FIGURE 5 that the slab includes in its thickness the plurality of layers of semiconductor material of predetermined conductivities 41 and 43 and the transition region 42 therebetween. The longitudinal section is taken so that its width includes the planar areas of the transition region corresponding to a face of the crystal. Wafers may then be diced from the slab as illustrated in FIGURE 6 (where the disposed of portion of the slab is indicated in dotted lines) thereby resulting in a wafer illustrated in FIGURE 6A which comprises two layers of single crystal semiconductor material of differing conductivities 41 and 43 with the transition region 42 positioned therebetween. In this wafer the transition region 42 is planar and the area thereof commensurate with that of the wafer itself.

If the layers 41 and 43 have been appropriately doped, there may be formed a diode with an n layer of semiconductor material and a p layer of semiconductor material separated by a p-n junction. Appropriate leads may be applied by means of solder or otherwise as is well known in the art. The device thus made would then be positioned in a housing by means known in the art in order to provide a finished semiconductor diode.

Figure 7A:
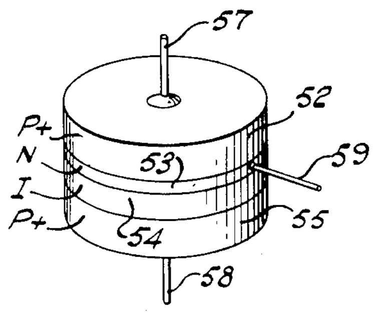

Other semiconductor bodies and devices fabricated therefrom may also be manufactured utilizing the method of the present invention as above described. In FIGURE 7 there is illustrated a portion of a silicon crystal wherein four layers of different conductivities are grown on the crystal for the specific purpose of eventually forming a p-n-i-p transistor. In FIGURE 7 the seed crystal is designated as 51. The first-deposited layer is a p+ layer 52 which is grown to the stage where the outer surface of the layer is hexagonally disposed about the longitudinal axis of the crystal. The conductivity is p-type and the resistivity of the layer is less than 0.01 ohm centimeter. The second-deposited layer 53 is an n-type layer and deposition is effected to form the layer with a thickness of about 0.1 mil. The resistivity of the layer is 0.5 ohm centimeter. An intrinsic layer I, designated 54, is then deposited to a thickness of about 1 mil with a resistivity of 10 ohm centimeters. The final layer 55 is deposited as a p+ layer with a thickness of about 5 mils and a resistivity of less than 0.01 ohm centimeter to form the semiconductor body from which the p-n-i-p transistor may be fabricated. The crystal illustrated in FIGURE 7 may be sectioned on the dashed line A illustrated, in a way which will provide a thickness in the first-deposited p+ layer of about 2 mils. The wafer forming the semiconductor body may then be diced as illustrated by the dashed circle on the crystal face designated 56 to form the body illustrated in FIGURE 7A. Appropriate leads 57, 58 and 59 are placed by known techniques on the two p+ layers and the n layer. The semiconductor body may then be housed in a suitable, known manner to form the p-n-i-p transistor device.

Figure 8:
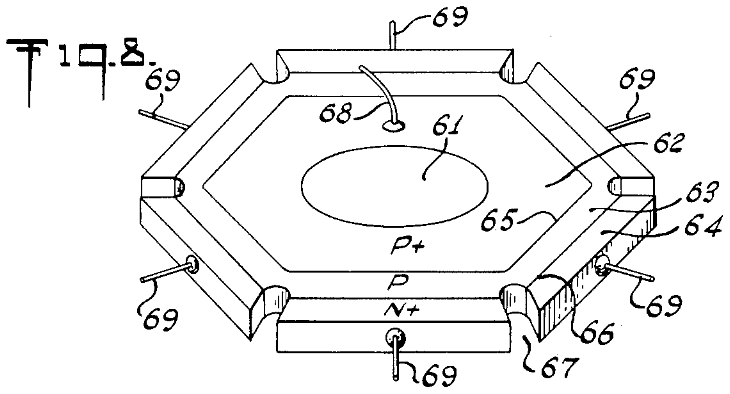
Figure 9:
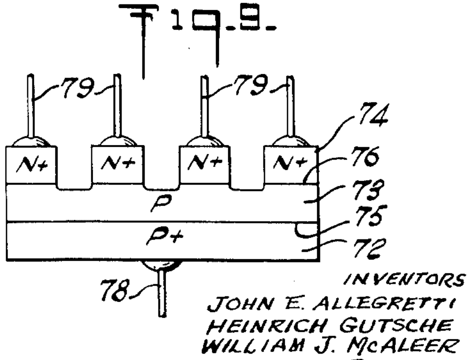

FIGURES 8 and 9 illustrate structures fabricated by co-workers using sections of a crystal formed in accordance with this invention for use in the formation of a multitude of devices in one crystal slab. In FIGURE 8 the seed crystal is designated as 61. A first-deposited layer 62 is formed on the seed crystal to a thickness adequate to form the polygonally-disposed layer surface. The layer is made p+ with a conductivity of below 0.01 ohm centimeter. A second layer 63 is then deposited with appropriate doping to form a p layer approximately 12 mils in thickness and with a resistivity of about 100 ohms centimeters. Finally, an n+ layer 64 is grown on the crystal to a thickness sufficient to enable contact to be made, e.g., 10–15 mils, and with a conductivity of below 0.01 ohm centimeter. As is apparent to those skilled in the art, a sharp transition region 65 exists between the first two deposited layers and a p-n junction 66 appears between the p and n+ deposited layers. Various areas of the n+ layers are isolated each from the other as, for example, by a cut designated 67. By providing a lead 68 to the p+ layer and leads 69 to the n+ layer, there is formed in the figure illustrated a battery of six rectifiers. It is apparent that such a device can be used to split A.-C. current which may be fed into the device through line 68 into many lines 69 of D.-C. current from the assembly.

A device with similar electrical characteristics and utility may also be formed as illustrated in FIGURE 9 where the device is formed from a longitudinal section of the same crystal rather than a transverse section as used in FIGURE 8. In the structure illustrated in FIGURE 9, the p+ layer 72 is a continuous layer and in forming the longitudinal section by cutting, as hereinbefore described, a thickness of about 10 mils is provided in the p+ layer. Appropriate cuts 77 are made in the face of the crystal through the n+ layers to the p layer to isolate areas of n+. A lead 78 is attached by known methods to the p+ layer and leads 79 are attached to each individual n+ area. Again, the devices have within them a sharp transition region 75 between the p+ and p layers 72 and 73 and a p-n junction 76 between the p layer 73 and the n+ layer 74. Similarly to the device disclosed in FIGURE 8, the source of A.-C. current fed through lead 78 to the p+ layer 72 will result in a flow of D.-C. current through each of conductors 79. In the case of both the devices illustrated in FIGURES 8 and 9, it is apparent that the substantially degenerate p+ and n+ layers enable the conductors to be attached to the semiconductor body through common techniques.

As is illustrated by the devices shown, any desired type of semiconductor device may be made by utilizing the method of the present invention. In each case, the semiconductor device will include at least two layers of semiconductor material having different conductivities and separated by a transition region. In some instances the transition region will be a p-n junction, while in other instances it may be a p-i or an n-i junction and in still other instances it may be a sharp transition region between layers of high and low resistivity material of thte same conductivity type. It will be appreciated that where reference is made herein to different conductivities in layers in any assembly thereof that the difference may be either in kind or in degree. In the case of a p-n junction the layers separated thereby may have the same degree of conductivity (or resistivity) but the type of conductivity will, of course, be different. Alternatively in the case of, for example, an n+n transition region the conductivity type will be the same for the layers but the degree of conductivity will, of course, be different. In any case, however, the width of the layers of material and the location and type of the junction or transition region may be very accurately defined and controlled by the method of the present invention.

As indicated above, while the specific techniques of this invention have been described with respect to silicon as the semiconductor material, it will be appreciated that the invention may be employed in the formation of semiconductor bodies having a plurality of layers of semiconductor material of differing conductivities separated by a transistion region, wherein each layer may be the same semiconductor material and other than silicon, for example, germanium, silicon carbide, various Group III–V compounds such as gallium arsenide, indium-antimonide, gallium phosphide, and the like, and wherein individual layers may be composed of differing semiconductor materials. In the latter instance it is important, of course, that essentially single crystal growth be maintained and hence consideration must be given when depositing layers of dissimilar materials to the crystallography of the layer on which growth occurs and that of the grown layer, thereby preserving the single crystal characteristics to the greatest degree possible.

As is apparent, any such semiconductor materials may be used where a vapor source of atoms of the semiconductor material and appropriate active impurity atoms therefor may be obtained. The vapor source must be capable of thermal decomposition and liberation of atoms of semiconductor material at the temperature to which the seed crystal upon which growth will occur may be heated, which temperature cannot exceed the melting point of the seed crystal or any deposited layer thereon. Consistent with these criteria, selection of an appropriate vapor source of the particular semiconductor material desired in any specific layer is possible. It is known, for example, that germanium crystals may be grown from vapors of germanium halides.

The geometry of the crystal formed in accordance with this invention will vary from the hexagonal cross-section form described with respect to silicon when other semiconductor materials are used. For example, the monocrystalline germanium polyhedral crystals formed in accordance with this invention will have a four-sided geometric configuration and at least some Group III–V metal semiconductor crystals will have a triangular cross-section.

It will be appreciated that the foregoing description of this invention is detailed for the purposes of illustration but that the invention should not be considered limited to such detail and the scope of the invention should be construed only in accordance with the appended claims.

What is claimed is:

1. An essentially monocrystalline elongate polyhedral semiconductor body (a) having a finite length along a longitudinal axis of a central generally rod-shaped cylindrical core of said monocrystalline semiconductor material and a polyhedral form on a section perpendicularly transverse to the longitudinal axis, (b) with the longitudinal axis of said core crystallographically oriented with respect to the mono-crystalline structure of the core so that the plane perpendicularly transverse to the axis has low Miller indices, with two of such indices each being the integer one, and with the sum of the integers of all three of such indices, disregarding any negative signs, not exceeding four, (c) having a plurality of first planar surfaces each essentially parallel to the longitudinal axis of the core, with at least the principal surface of such first planar surfaces disposed around such longitudinal axis at a substantially equal distance therefrom measured along lines perpendicular to the respective planar surfaces, (d) with each of said first planar surfaces being the outer surface of a layer of a substantially uniform thickness of monocrystalline semiconductor material of a first electrical conductivity, beneath which, and separated therefrom by a planar transition region of substantially uniform thickness, is an inner body of the semiconductor material in monocrystalline form, having a second electrical conductivity which is different from that of said first electrical conductivity, (e) with the outer surface of said inner body having second planar surfaces parallel to, and uniformly spaced inward from, the respective first planar surfaces, (f) with the inner surfaces of said inner body being essentially a cylindrical annulus and monocrystallographically bonded to the outer surface of said core, and (g) with the outer surfaces of said inner body monocrystallographically bonded to the layer having the first planar surfaces, (h) said planar surfaces being vapor deposited.

2. The semiconductor body of claim 1 in which the semiconductor material is silicon.

3. The semiconductor body of claim 2 in which the polyhedral form of said semiconductor body is essentially a regular hexagon.

References Cited by the Examiner

UNITED STATES PATENTS

| | | | |
|---|---|---|---|
| 2,703,296 | 3/1955 | Teal | 148—173 |
| 2,763,581 | 9/1956 | Freedman | 148—175 |
| 2,841,860 | 7/1958 | Koury | 148—173 |
| 2,854,363 | 9/1958 | Seiler | 148—189 |
| 2,858,730 | 11/1958 | Hanson. | |
| 2,890,976 | 6/1959 | Lehovec | 148—171 |
| 2,908,004 | 10/1959 | Levinson | 148—1.6 |
| 3,004,835 | 10/1961 | Verner et al. | 23—223.5 |
| 3,034,871 | 5/1962 | Stewart | 148—1.6 |

OTHER REFERENCES

Buckley: Crystal Growth, John Wiley and Sons, Inc., New York, 1951, pp. 94–97.

Doremus et al.: Growth and Perfection of Crystals, John Wiley and Sons, Inc., New York, 1958, pp. 74 and 75.

Hannay: Semiconductors, Reinhold Publishing Corporation, New York, 1959, page 103.

DAVID L. RECK, *Primary Examiner.*